United States Patent [19]
Dufour

[11] Patent Number: 6,130,561
[45] Date of Patent: *Oct. 10, 2000

[54] METHOD AND APPARATUS FOR PERFORMING FRACTIONAL DIVISION CHARGE COMPENSATION IN A FREQUENCY SYNTHESIZER

[75] Inventor: Yves Dufour, Sunnyvale, Calif.

[73] Assignee: Philips Electronics North America Corporation, New York, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 09/221,948

[22] Filed: Dec. 28, 1998

[51] Int. Cl.⁷ ........................................... H03B 21/00
[52] U.S. Cl. ..................... 327/105; 327/115; 327/117; 327/148; 327/149; 327/150; 377/48
[58] Field of Search ................................ 377/48; 327/115, 327/117, 105, 148, 149, 150

[56] References Cited

U.S. PATENT DOCUMENTS

| | | | |
|---|---|---|---|
| 5,180,993 | 1/1993 | Demt | 331/16 |
| 5,465,061 | 11/1995 | DuFour | 327/112 |
| 5,781,048 | 7/1998 | Nakao | 327/157 |
| 5,834,987 | 11/1998 | Dent | 332/127 |
| 5,861,766 | 1/1999 | Baumer et al. | 327/105 |

*Primary Examiner*—Margaret R. Wambach
*Attorney, Agent, or Firm*—Brian J. Wieghaus

[57] ABSTRACT

Compensating for phase nonalignment between VCO frequency divider and referenced frequency signal in a fractional-N PLL is provided by compensation implemented by a variable charge pump system. Phase comparator logic is configured to turn ON some of the charge pumps of the charge pump system early and the rest of the charge pumps later. This process effects an equivalent charge being turned ON at the exact point in time for properly compensating for the fractional charge.

25 Claims, 6 Drawing Sheets

METHOD AND APPARATUS FOR PERFORMING FRACTIONAL DIVISION CHARGE COMPENSATION IN A FREQUENCY SYNTHESIZER

BACKGROUND OF THE INVENTION

1. Technical Field

The present invention relates to fractional-N frequency synthesis, more particularly to methods and systems for fractional-N charge compensation through the use of a variable charge pump system.

2. Background Art

Frequency synthesizers play a key role in a variety of technology industries. For example, they are implemented in numerous communication and computing applications. These applications include electronic devices such as AM/FM radios, digital cellular phones and spread spectrum receivers as well as computing devices. A frequency synthesizer conventionally utilizes a phase-lock loop circuit (PLL) and a divider coupled to a voltage controlled oscillator to reliably produce frequencies that are multiples of a reference input source.

In the design of a PLL circuit, two opposing engineering parameters need to be considered. The first is channel spacing. This parameter reflects the ability to achieve discrete frequencies that are multiples of a comparison frequency, as dictated by the following equation:

$$f_{VCO} = N_{VCO} \times f_{Comp} \quad (1)$$

where $f_{VCO}$ is the frequency of the voltage controlled oscillator (VCO), $N_{VCO}$ is the divide ratio of the VCO divider, and $f_{Comp}$ is the comparison frequency.

A small channel spacing permits many channels to occupy a given bandwidth and is, thus, desirable. This can be attained through the use of a low comparison frequency. Small channel spacing, however, compromises the second parameter, that of channel switching time. Channel switching time represents the ability of the PLL circuit to switch from a given channel (VCO frequency) to another channel (i.e., frequency). The switching of channels results from modifying the division ratio. Other parameters that impact switching time include VCO gain, charge pump current, and loop filter characteristics. A small channel spacing necessarily results in a slower channel switching time. For a faster switching time as well as lower noise, a high comparison frequency is required, but yields large channel spacings.

Consequently, a number of different methods have been developed to address the above problem. One known method implements a variable comparison frequency. Under this approach, the divide ratios of a reference divider and a VCO divider are manipulated to create a very high comparison frequency. Afterwards, the regular divide ratios are used to fine tune the actual frequency. A second method is to dynamically change parameters of the Low Pass Filter (LPF) and the charge pump. A third type of method, which is the subject of the present invention, is to use a non-integer divider (i.e., fractional-N PLL).

In a general fractional-N technique, the comparison frequency can be made high (which provides, for example, better phase resolution and thus yields a faster switching time) while maintaining the same VCO frequency (which preserves the channel spacing). This can be achieved because the multiplier $N_{VCO}$ of equation (1) is a fractional number. In terms of actual implementation, the frequency of the oscillator output signal is divided periodically with mutually different integers (e.g., N, then N+1), such that the frequency, is on an average, divided by a value equal to an integer N plus or minus a numerical fraction whose absolute value is smaller than one.

The exact divide ratio is not used. Instead, integer divisors that are one below and one above are utilized so that, on average over a time period, a fractional divide ratio results. One side effect is that spectral peaks emerge at the channel spacings. Smaller loop filter bandwidth reduces the peaks, but does not eliminate them. These peaks at the spacings cause interference with the neighboring channels. Fractional-N compensation provides an effective way to attenuate these undesired peaks. With this scheme, small channel spacing can be obtained while the switching speed is increased.

FIG. 1 shows a conventional fractional-N frequency synthesizer implemented in an integrated circuit employing fractional-N compensation. The reference source 101 outputs a reference signal to a reference divider 103 that produces a divided reference signal to a phase comparator 105. The phase comparator 105 detects the phase difference between the frequency of the divided reference signal (also called comparison frequency) and the frequency of the signal from a Voltage Controlled Oscillator (VCO) divider 109. The input to the VCO divider 109 originates from a VCO 113. The VCO divider 109 drives an accumulator 111 that, upon an overflow, outputs a signal to the VCO divider 109, which then divides by N+1. The information supplied by VCO divider 109 to the accumulator 111 represents the numerical divide ratio the VCO divider 109 is using so that the accumulator 111 may cause a compensation charge pump 117 to appropriately compensate in proportion to the accumulator content. The output of the phase comparator 105 is the phase error between the comparison frequency and the divided VCO frequency; this phase error is fed into a main charge pump 107, which provides a current pulse that is proportional to the phase error. The compensated current (i.e., error signal) is filtered via a low-pass filter (LPF) 115 and then applied to the control input of the VCO 113 to produce an output signal that more accurately tracks the phase of the comparison signal. The VCO output signal is then fed back into the VCO 113 to align the divided VCO frequency to the comparison frequency. The process continues until a zero phase error is attained, whereby the two frequencies are properly aligned.

FIG. 2 is a timing diagram that illustrates the concepts involved in fractional-N compensation. Fractional-N compensation can be effectively performed because a number of system parameters are known, and therefore can be used to mitigate the undesired effects of the PLL circuit. Comparison signal 201 is shown in the time domain. Main N VCO cycles 203 correspond to the VCO divider 109, which divides by N and then N+1 so that the average yields a fractional N. Because the divide ratio is non-exact, the edges of the comparison signal 201 and the Main N VCO cycles 203 do not coincide, as is evident by the phase comparator output 205.

In response to the output of accumulator 111, as influenced by the phase comparator output 205, the compensation charge pump 117 supplies an opposite current to compensate for the phase error (i.e., delay) as shown by the fractional compensation current graph 209. The content of the accumulator counter 207 provides information on the phase error and is used to produce the compensation current. In this example, the fractional ratio is five and the fractional accumulator value is two; the fractional accumulator value may be set to any integer number between zero and the fractional ratio, depending on the application. The accumulator counter content 207 is proportional to the fractional phase ripple caused by the fractional division.

The amount of error is known and can be stored and tracked through the use of the accumulator counter 111 Graph 211 illustrates a signal which is the sum of the outputs of the main charge pump 107 and of the compensation charge pump 117. Note that graph 211 represents one sum signal despite the scale being different above and below the horizontal axis. For proper fractional-N compensation, the area of the fractional compensation current pulse must be equal to the area of the charge pump ripple output.

The undesired current from the main charge pump creates unwanted peaks as discussed earlier, and thus, should be minimized. The charge from the charge pump (i.e., fractional noise) is governed by the following equation:

$$Q = I_{pump} \times FRD \times (t_{VCO}/\text{Frac\_ratio}) \quad (2)$$

where Q is the total charge, $I_{pump}$ is the current outputted from the charge pump, FRD is the accumulator counter value, $t_{VCO}$ is the VCO period, and Frac_ratio is the fractional ratio. Because these parameters are known, the charge Q can be readily computed. Therefore, the undesired charge Q can be offset by providing a −Q charge in the LPF 115 via an additional charge pump (i.e., compensation pump).

The generation of the −Q charge is the crux of the problem in the fractional-N compensation scheme. One technique in the prior art provides the compensation charge in accordance with the following general equation:

$$Q_{comp} = -I_{comp} \times \text{Comp\_pulse\_length} \times FRD \quad (3)$$

where $Q_{comp}$ denotes the compensation charge generated by the compensation pump; $I_{comp}$ is the current produced by a unity compensation pump (i.e., FRD is 1); FRD is the accumulator counter value; and Comp_pulse_length is the duration of the compensation pulse. FRD is present in Equation (3) to scale $Q_{comp}$ to the total compensation current, Icomp×FRD.

One known technique utilizes a Comp_pulse_length of $2 \times T_{XTAL}$ (where $T_{XTAL}$ is the crystal period). Equating Q with $Q_{comp}$ yields the following:

$$I_{pump} \times FRD \times (t_{VCO}/\text{Frac\_ratio}) = I_{comp} \times \text{Comp\_pulse\_length} \quad (4a)$$

$$I_{pump} \times FRD(t_{VCO}/\text{Frac\_ratio}) = I_{comp} \times \text{Comp\_pulse\_length} \quad (4b)$$

$$I_{pump} \times FRD \times (t_{VCO}/\text{Frac\_ratio}) = I_{comp} \times 2 \times T_{XTAL} \quad (4c)$$

Expression (4c) constitutes the final mathematical reduction, which indicates that the compensation scheme relies primarily on these parameters (where FRD is the accumulator value at a particular point in time; and Frac_ratio is the fractional ratio value).

The expression reveals the existence of both matching and tuning problems, resulting in many drawbacks associated with this conventional technique of compensation. The expression (4c) specifically reveals that significant tuning of $I_{comp}$ is needed, with respect to $I_{pump}$, FRD, $T_{XTAL}$, and $T_{VCO}$. The matching problem is mainly because the amplitudes of $I_{pump}$ and $I_{comp}$ are significantly disparate; $I_{pump}$ has a large amplitude (in the order of mA), whereas, $I_{comp}$ has a much smaller amplitude (in the order of $\mu$A). Such disparity arises because Comp_pulse_length is typically significantly longer than $T_{VCO}$/Frac_ratio (e.g., 200 ns versus 0.1 ns). The matching of the two currents in terms of tuning voltages and temperature variations is a difficult task. Various prior methods of matching include, for example, external current tuning, and software control of the charge pumps.

However, these matching approaches are inconvenient in that different applications require manual readjustment of a multitude of parameters. Because of the amplitude level disparity, the components that are used to generate $I_{pump}$ and $I_{comp}$ are different. A PNP transistor may be utilized to supply $I_{pump}$ because it can better handle large amplitude currents and concomitant speed requirements. In contrast, $I_{comp}$ uses a PMOS transistor, which can accommodate the much smaller signal levels with reduced area and increased accuracy and speed.

A technique has been developed to attempt to mitigate the recognized problems related to matching component behavior and timing, which have plagued past implementations. This technique, for example, involves generating the compensation charge using the following equation:

$$Q_{comp} = -I_{comp} \times t_{VCO} \times 64 \quad (5)$$

where $Q_{comp}$ denotes the compensation charge generated by the compensation pump; $I_{comp}$ is the current produced by the compensation pump; and $t_{VCO}$ is the VCO period. The resultant expression from equating Q to $Q_{comp}$ is as follows:

$$I_{pump} \times FRD/\text{Frac\_ratio} = I_{comp} \times 64 \quad (6)$$

This expression indicates that the variability is reduced because $t_{VCO}$ and $t_{XTAL}$ have been removed from the equation.

Comp_pulse_length is largely dictated by the particular application. For example, instead of 64, 128 can be used for some applications. With 64, assuming FRD is 1 and a Frac_ratio of 5, the current ratio ($I_{pump}/I_{comp}$) is 320, which still poses issues with matching due to the amplitude disparity.

Although the above technique eliminates some amplitude disparity, the drawbacks associated with timing and component matching remain. Notably, applications requiring higher frequencies encounter more effects of the mismatch problems.

Moreover, because the fractional compensation pump is required to compensate for the main pump according to the phase error from the fractional divider, it disadvantageously needs to be adapted for every charge pump setting. In short, implementation is difficult. The dynamic behavior of the compensation pump is critical given the small scale of the currents, which is greatly impacted by capacitive coupling issues. For example, the currents are around 20 nA switched for 1 $\mu$s, and the compensation charge can be as low as 20 fC.

Hence, a primary disadvantage of the current methods is the difficulty associated with proper matching of the charge pumps. Another disadvantage concerns the difficulty in filtering the undesired frequency components. Yet another disadvantage is introduction of fractional charge into the spectral output, causing interference with neighboring channels.

DISCLOSURE OF THE INVENTION

There is a need for an arrangement that easily matches the charge pumps used in a fractional-N compensation scheme and filters undesired frequency components introduced by fractional division. There is also a need for an arrangement that exhibits small channel spacing while preserving fast switching as well as low noise levels. A need also exists for an arrangement that reduces or eliminates fractional charge into the low pass filter.

These and other needs are attained by the present invention, where a phase comparator selectively turns ON a portion of charge pump system earlier than the reference input frequency, and then turns ON the remaining portion of the charge pump system later than this reference input frequency.

In accordance with one aspect of the present invention, a fractional-N frequency synthesizer comprises an accumulator for storing a value corresponding to a fractional ratio. A VCO divider receives and divides a voltage controlled oscillator (VCO) pulse train to generate a divided VCO pulse train. The divided VCO pulse train is divided respectively by N and by N+1 in response to an output of the accumulator, wherein the accumulator provides a control signal to the VCO divider instructing the VCO divider to change the division from N to N+1 if the VCO divider is dividing by N or from N+1 to N if the VCO divider is dividing by N+1, where N is an integer. A phase comparator receives a divided reference pulse train and a divided VCO pulse train and outputs phase error pulses with widths in proportion to a timing difference between the divided reference pulse train and the divided VCO pulse train. A charge pump system comprises a plurality of charge pumps. The phase comparator includes compensation logic to selectively drive the charge pump system, in which the compensation logic turns ON a first portion of the charge pumps early and a second portion of the charge pumps late to drive the charge pump system to output a compensated current proportional to the phase error pulses. The fractional-N scheme as described advantageously eliminates the problems of matching a main charge pump with a compensation charge pump by using a charge pump system with a plurality of charge pumps of similar scale and structure to effect a compensated current.

Another aspect of the present invention provides a fractional-N frequency synthesizer circuit comprising an accumulator configured for storing a value that corresponds to a fractional ratio. A delay circuit is configured for supplying a divided VCO signal and a delayed VCO signal, dividing the VCO signal, wherein a timing difference between the divided VCO signal and the delayed divided VCO signal is an integer multiple of VCO cycles. A charge pump system is configured for outputting a compensated current. A phase comparator is configured for driving a portion of the charge pump system in response to the divided VCO signal and for driving a remaining portion of the charge pump system in response to the delayed divided VCO signal. Under this arrangement, the advantages of fractional-N compensation (e.g., smaller channel spacing and faster switching time) is preserved without the traditional problem of matching.

Yet another aspect of the invention provides a method of providing fractional-N compensation. The method comprises generating a VCO signal, dividing the VCO signal, generating a delayed divided VCO signal that is an integer multiple of VCO cycles away in time from the divided VCO signal, detecting a phase error between a divided reference signal and the divided VCO signal, selectively activating a portion of a charge pump system based upon the divided VCO signal, the charge pump system comprising a plurality of charge pumps, activating a remaining portion of the charge pump system based upon the delayed divided VCO signal, outputting a compensated current produced by the charge pump system; and filtering the compensated current for input into a VCO for producing said VCO signal. The described method advantageously meets desired matching objectives of circuit components; namely the charge pumps.

Additional advantages and novel features of the present invention will be set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF DESCRIPTION OF DRAWINGS

Reference is made to the attached drawings, wherein elements having the same reference numeral designations represent like elements throughout and wherein.

DETAILED DESCRIPTION OF THE INVENTION

A fractional-N compensation arrangement is described herein as an exemplary embodiment involving a fractional-N synthesizer utilizing a fractional ratio of five with a VCO frequency of 1 GHz. It will become apparent, however, that the present invention is also applicable to other fractional ratios and VCO frequencies.

Figure 3:
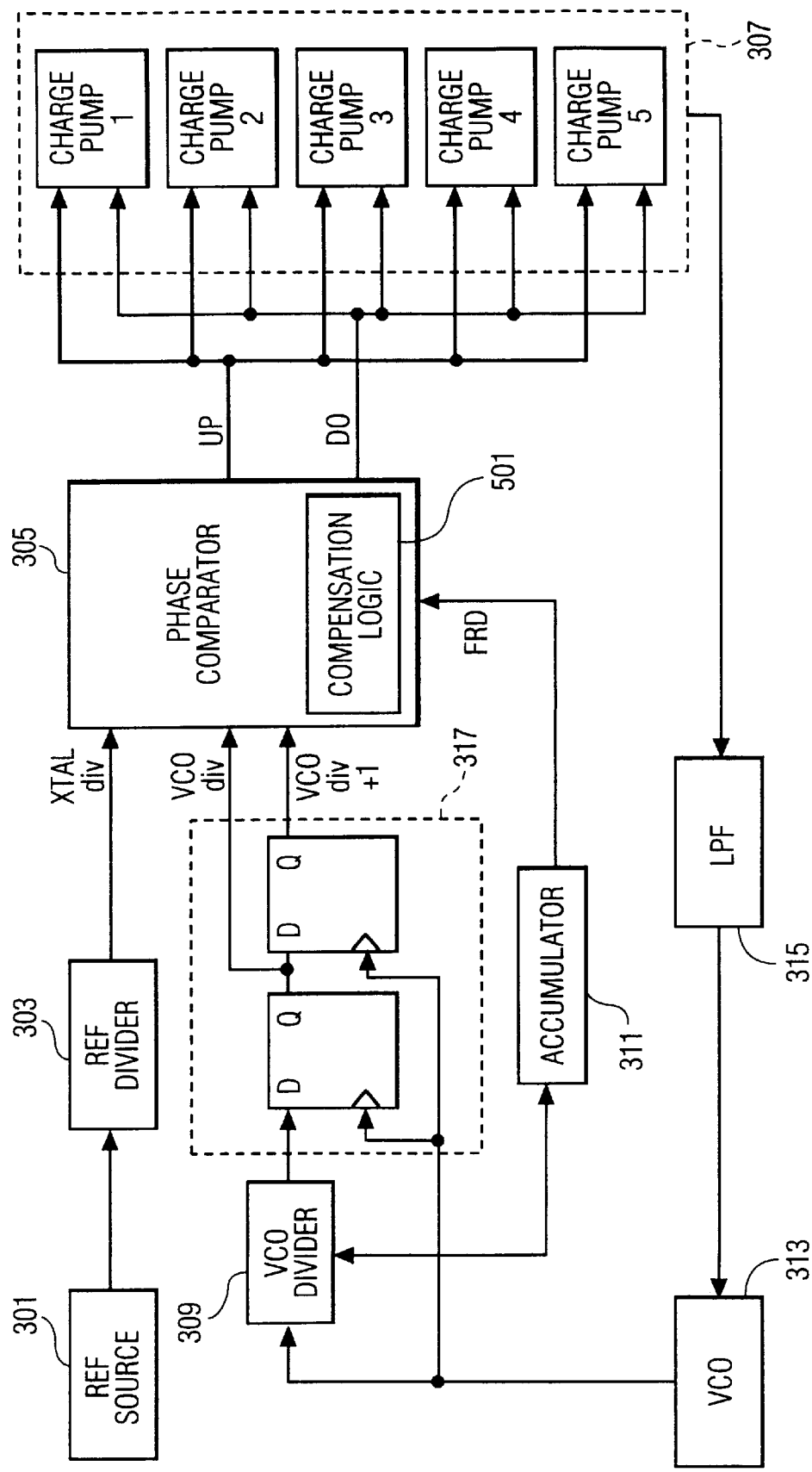
FIGS. 3 is a block diagram of a fractional-N compensation arrangement constructed according to an embodiment of the present invention.

FIG. 3 shows a preferred embodiment of the present invention whereby fractional-N compensation is accomplished without the aforementioned problems associated with conventional fractional-N compensation schemes. The operation of the circuit is as follows. A reference signal from a reference source (Ref Source) 301, which can be a crystal oscillator or an external input frequency source is fed into reference divider 303. In turn, the reference divided signal is inputted into phase comparator 305. The phase comparator 305 also receives two additional inputs, VCO divided and VCO (divided +1), from a delay circuit 317. VCO div denotes a divided VCO frequency, and VCO (divided +1) is a divided VCO frequency plus one VCO cycle. Alternatively, the delay could be an integer multiple of VCO cycles. The delay circuit 317 obtains its inputs from the output of a VCO divider 309 and the output of a VCO 313 itself. For example, if the VCO divider 309 is dividing by N+P/R, where N is an integer (e.g., 287), P is the fraction (e.g., 2) and R is the fractional ratio (e.g., 5), the division is by 287.4 under this example. An accumulator 311, which is a digital counter whose value is used to compute the total output charge of the charge pump 307, receives an output signal from the VCO divider 309. The accumulator 311 is incremented by P at every comparison cycle and overflows at R. At overflow, the accumulator 311 signals the VCO divider 309 to divide by 1 more than the current divider value; and, the FRD value (current value of the accumulator) is used to determine the compensation current.

In accordance with particular embodiments of the invention, the delay circuit 317 is made up of two D type flip-flops. A delay circuit 317 provides accurate compensation of the fractional charge; therefore, precise timing of the circuit is imperative. Alternatively, a divider circuit which has a similar delay circuit can be used to provide VCO and VCO+1 signals. A VCO divider that provides VCO and VCO+1 signals is known to those skilled in the art, and is disclosed, for example, in European Pat. No. 0517335.

The phase errors are outputted from the phase comparator 305 to the charge pump system 307, which has, in one embodiment, individual charge pumps equal in number to the fractional ratio. These individual charge pumps can be manipulated to compensate for the fractional charge via the compensation logic 501 of the phase comparator 305. In another embodiment, the charge pump system 307 contains weighted charge pumps. The phase comparator 305 supplies an up-command signal (UP) and a down-command signal (DO) to drive the system of charge pumps 307. The compensation logic 501, which drives charge pump system 307, within the phase comparator 305 will be discussed later with respect to FIG. 5. The charge pump system 307 per this example comprises five separate, identical charge pumps. Under this scheme of fractional-N compensation, the number of charge pumps must be a multiple of the fractional ratio (which in the preferred embodiment is five). Five is preferred because of design complexity; a higher number would yield a more complex system with an excessively large accumulator more susceptible to inaccurate compensation. Alternatively, the charge pump system may comprise a number of weighted charge pumps such that the weighting is based on the fractional ratio. For example, instead of five identically weighted charge pumps, three charge pumps can be used with weights of 1, 1, and 2. Using this weighting arrangement, any fractional accumulator (FRD) value between 0 and 4 can be obtained. Also, larger fractional ratios can be readily accommodated under a weighted system of charge pumps. The primary advantage of using charge pump system 307 (weighted or non-weighted) is that no separate compensation charge pump is needed; this eliminates the matching problems associated with having a separate compensation charge pump that handles such disparate current levels from the main pump.

As shown generally in the FIG. 3, each of the individual charge pumps receives either an UP signal or a DO signal at any given time. The fractional accumulator (FRD) value is supplied to the phase comparator 305 so that the phase comparator may generate the UP and DO signals with proper timing. Based upon the UP and DO signals, some of the charge pumps are turned ON at times corresponding to VCO divided, while the balance are turned ON at VCO divided+1, which is one VCO cycle later. For example, three charge pumps could be turned ON first, then 1 ns later (assuming a VCO frequency of 1 GHz), the remaining two charge pumps will be triggered.

Figure 4:
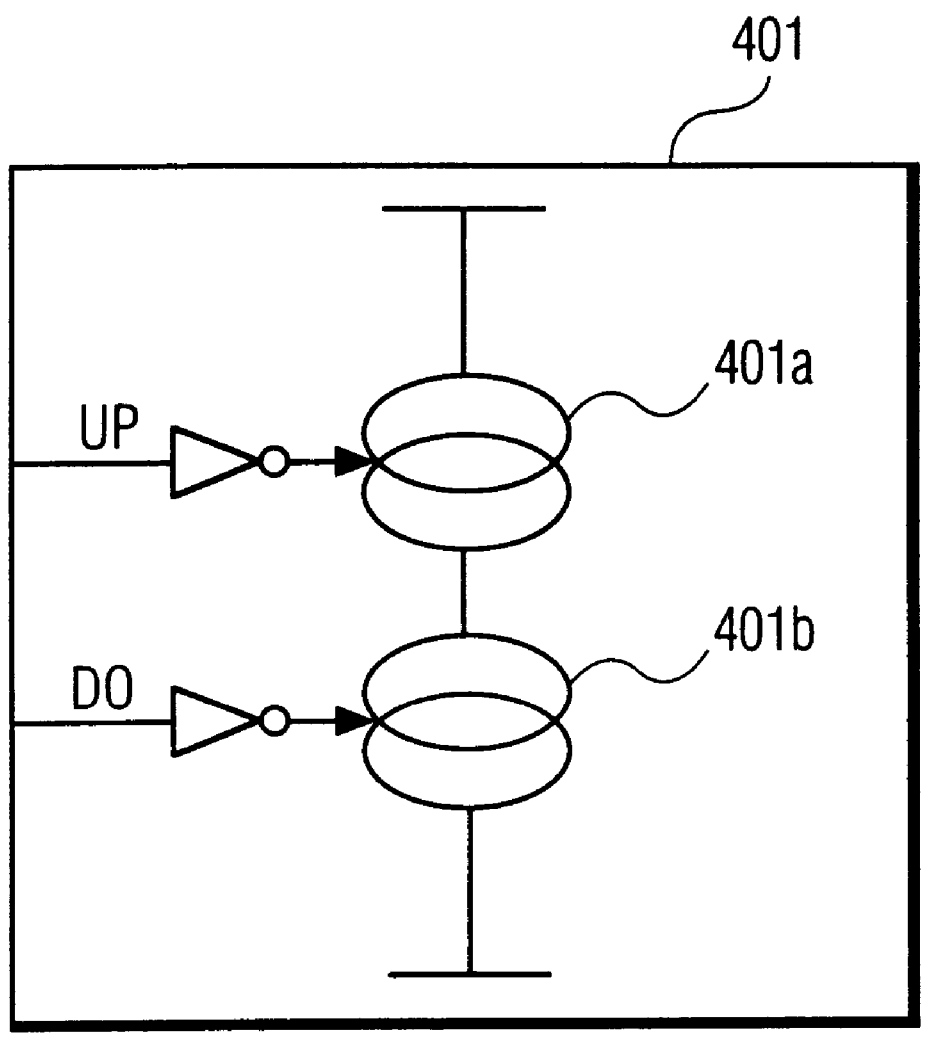
FIG. 4 is a diagram of a charge pump within the charge pump system in accord with embodiments of the present invention.

FIG. 4 shows one charge pump 401 in the charge pump system 307 of FIG. 3. The UP signal activates Ppump 401a, while the DO signal activates the Npump 401b. One implementation of the Ppump 401a uses a plurality of PNP bipolar transistors. The Npump 401b can likewise be made of a plurality of PNP transistors whose collector currents are coupled to the inputs of current mirrors formed by NPN bipolar transistors. Notably, the PNP transistors within the Ppump 401a and Npump 401b are of identical construction, which is desirable for matching purposes. The above implementation of these pumps is described in U.S. Pat. No. 5,465,061 to Dufour, which is incorporated by reference herein in its entirety. The transistors are of identical construction and form matched pairs, thereby ensuring a symmetrical operation of the Ppump 401a and the Npump 401b. The charge pump circuit disclosed in the U.S. Pat. No. 5,465,061 to Dufour, which has quick programming capability; specifically, the circuit comprises multiple pumps which may be turned ON at different times.

Figure 5A:
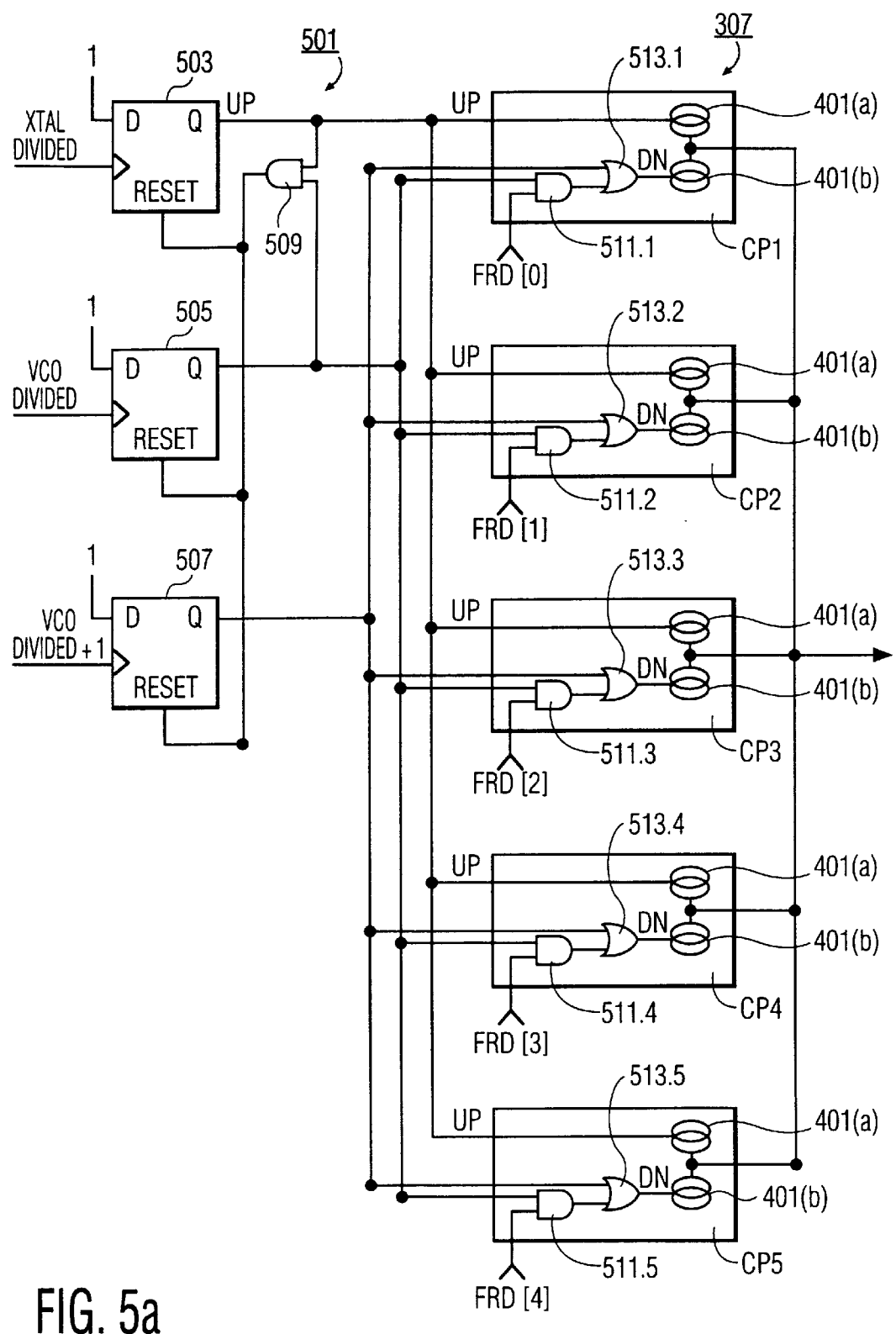
FIGS. 5a and 5b are structural and phase diagrams illustrating a phase comparator circuit according to embodiments of the invention.

FIG. 5 illustrates one embodiment of compensation logic 501 in conjunction with a system 307 of five equaly weighted charge pumps CP1–CP5. The arrangement shown in FIG. 5, provides a mechanism of partially turning ON the Npump 401b of some of the individual charge pumps CP1–CP5 at a time different from the turning ON the Npump of the remaining charge pumps. In this manner, the earliness of the typical compensation pump is curbed by turning ON only some of the Npumps of the small charge pumps CP1–CP5 at a time before the divided reference signal; the earlier the divider signal, the smaller the output current for the first VCO period. The rest of the Npumps are turned ON late (relative to the divided reference signal) so that over some time period, the total amount of charge is equivalent to the charge amount as if the pumps were turned ON at the exact time. In other words, the amplitude generated by the partially ON system of charge pumps 401 must be in proportion to the delay such that the amount of charge is offset correctly.

FIG. 5 shows an essentially two stage phase comparator 501 implemented according to a preferred embodiment of the invention. Additionally, FIG. 5 shows that each Npump 401 (b) of the charge pumps CP1–CP5 are modified to include a respective AND gate (511.1–511.5) who's output feeds a respective OR gate (513.1–513.5). The output of each OR gate 513.1–513.5 provides the DO signal to the respective Npump 401(b) of each charge pump. The D inputs to flip-flops 503, 505, 507 are a logic high. Flip-flop 503 receives its clock information from the reference divider 303 (i.e., crystal (XTAL) divider); its Q output is an UP signal, which is then inputted to AND gate 509. The other input to AND gate 509 is provided by the Q output of flip-flop 505. Flip-flop 505 receives its clock from the VCO divider. The output of AND gate 509 supplies the reset to all the flip-flops 503, 505, 507. Further, the Q output of flip-flop 505 serves as input to AND gates 511.1–511.5, each of which also receives the fractional accumulator (FRD) content information FRD[0], FRD[1], FRD[2], FRD[3], FRD[4], FRD[5] to be discussed further, as its other input from the accumulator 311 (FIG. 3). Thus, FRD content information is supplied to each one of the individual charge pumps. The output of each AND gate 511 is fed into a respective one of each of the OR gates 513.1–513.5. Flip-flop 507 is clocked from one VCO cycle off (i.e., VCO divided+1) of the clock of flip-flop 505. Each Or gate 513.1–513.5 also receives the Q output of flip-flop 507 in addition to the output of the respective AND gate 511. The OR gates 513 then output a DO (or down) signal to each respective Npump. Therefore, each of the flip-flops 503, 505, 507 contribute to the generation of the individual pump driving signals.

Figure 1:
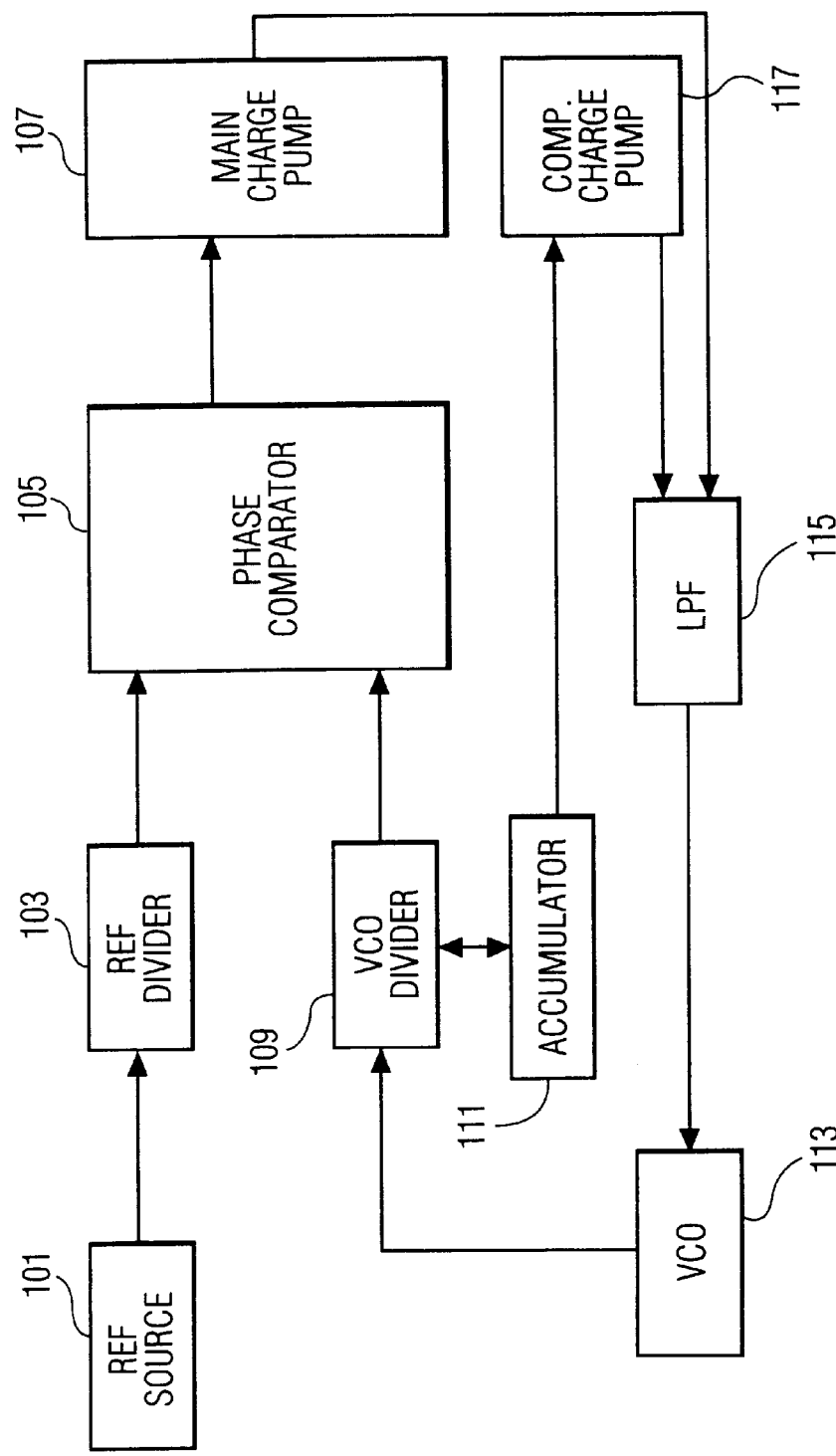
FIG. 1 is a block diagram of a conventional arrangement for performing fractional-N compensation.
Figure 2:
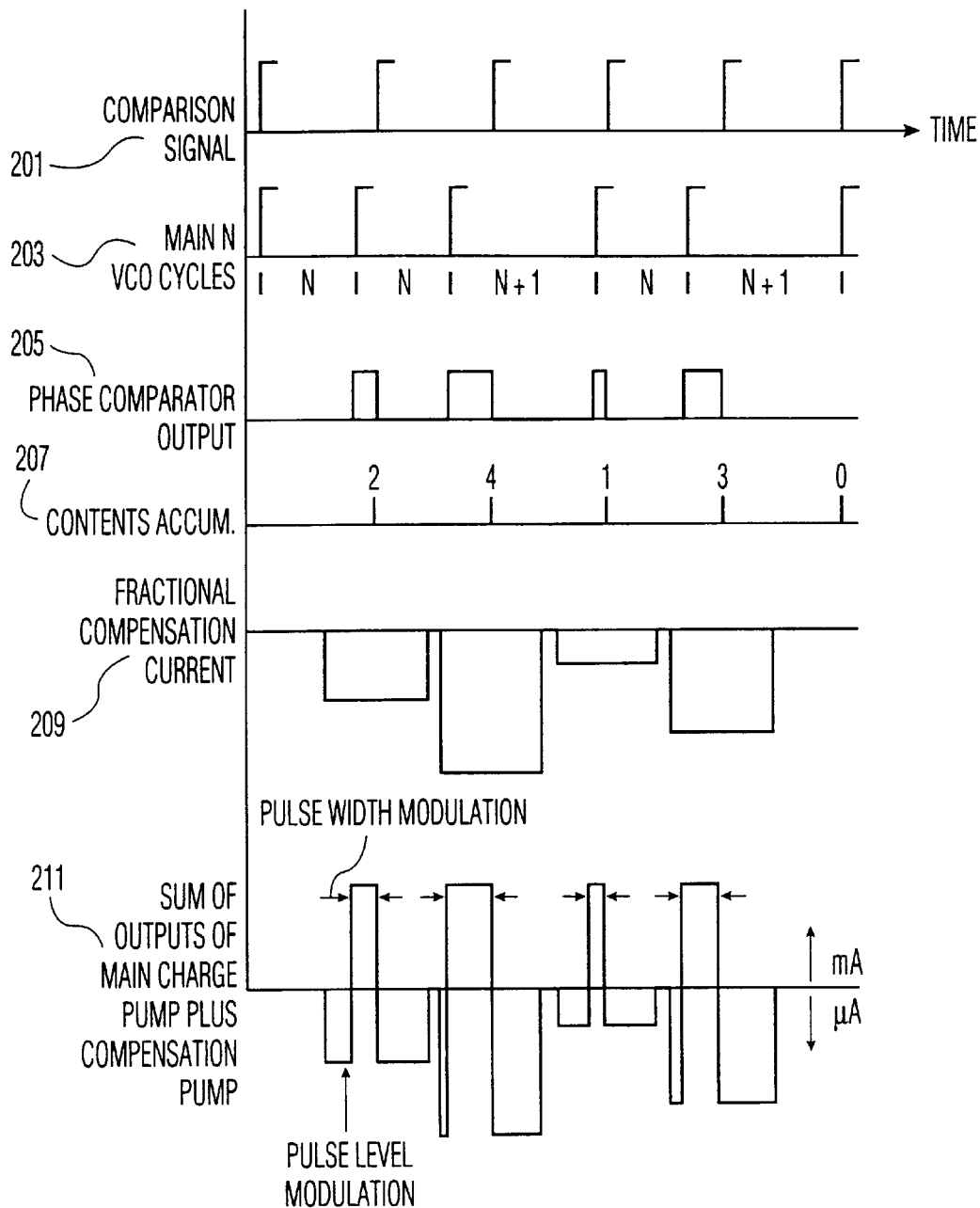
FIG. 2 is a diagram showing typical waveforms associated with the fractional-N compensation scheme of FIG. 1.

The FRD content information of accumulator 311 controls the timing of when the individual Npumps of the charge pump system 307 turn on relative to each other. The CONTENTS ACCUM 207 of FIG. 2 represents the value of accumulator 311 (FIG. 3) over time when the circuit is in lock. Because the charge pump system 307 in the embodiment of FIG. 5 is not weighted, the output of accumulator 311 is thermometer coded into 5 bits to represent accumulator values 0–5 as follows:

| Value | Code |
|-------|-------|
| 0 | 00000 |
| 1 | 00001 |
| 2 | 00011 |
| 3 | 00111 |
| 4 | 01111 |
| 5 | 11111 |

The thermometer value for value 5 is not actually used, but is included to maintain symmetry of the system. The 5-bit codes are applied to the FRD input of each charge pump with the most significant bit (MSB) being applied to charge pump CP1 and the least significant bit being applied to charge pump CP5. For example, with reference to FIG. 5 and the FRD chart above, when the FRD value is "3", the following bits are applied to the FRD inputs of charge pumps CP1–CP5: FRD[0]=0; FRD[1]=0; FRD[2]=1; FRD[3]=1; FRD[4]=1.

The logic of circuits 501 and of the charge pump CP1–CP5 operate as follows. First, the Ppumps 401(a) of all the charge pumps operate in sync; i.e. they all turn ON and OFF together as controlled by the Q output of flip-flop 503. When the Q output of flip-flop 503 goes high as a result of the signal XTAL divided going high, all the Ppumps 401 turn ON. When the signal XTAL divided goes low, all of the Ppumps turn OFF. As previously discussed, the purpose of the circuit of FIG. 5 is to turn on some of the Npumps 401(b) earlier than other ones of the Npumps. The Npumps are controlled by the signals VCO divided, VCO divided+1, and the FRD value. As evident from the respective AND and OR gates within each charge pumps CP1–CP5, the Npumps turn on when either or both of (i) the signal VCO divided+1 goes high or (ii) the signal VCO divided is high and the respective FRD bit is high. The Npumps turn off when neither of the above are true.

Figure 5B:
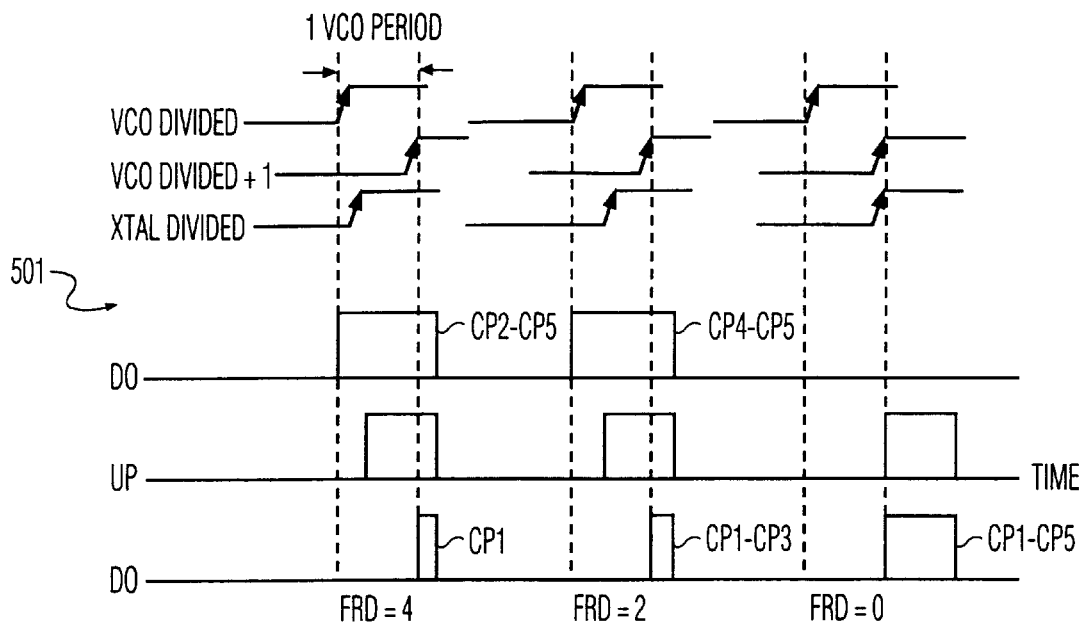

FIG. 5(b) illustrates how any one individual charge pump operates. Chart 501 shows exemplary signals VCO divided, VCO divided+1, and XTAL divided for three different examples (left, middle and right columns) corresponding to FRD values of "4", "2" and "0", respectively. Note that in each case the Ppump turns ON (signal UP goes high) when the signal XTAL divided goes high. FIG. 5 also shows the DN signals for an FRD value of "4" (left column) for the charge pumps CP1 and for the charge pumps CP2–CP5. Since the FRD bit input to the charge pumps CP2–CP5 is logic high, the DO signal for these charge pumps turns on early, i.e. as soon as the VCO divided signal goes high. Conversely, the DO signal for the pump CP1 turns on late; i.e. not until the VCO divided+1 signal goes high. When the FRD value is "2" (middle column), a logic low signal ("0") is applied to the AND gates 511.1, 511.2 and 511.3 and a logic high signal ("1") is applied to each AND gate 511.4 and 511.5. Since the FRD bit is logic high for pumps CP4 and CP5, the DO signal goes high when the signal VCO divided goes high, by reason of the AND gates 511. Because the FRD bits are logic low for pumps CP1–CP3, the DO signal does not go high when the VCO divided signal goes high. Rather, the DO signal does not go high until the VCO divided+1 signal goes high. Similarly, when FRD has a value "0", the FRD bit input to each charge pump is logic low. Consequently, none of the Npumps 401(b) turn on until the signal VCO divided+1 goes high, which is synchronous with the UP signal.

Note that the UP and DO signals are not illustrated as turning off at the end of the VCO period (as bounded by vertical dashed lines). Rather, the UP and DO signals turn off some time after the occurrence of the VCO divided+1 signal due to delay in the AND gate 509. Also, the logic of FIG. 5 is based on the reset signal coming after the VCO divided+1 rising edge, to ensure resetting of the flip-flop 507.

Note also that while some of the logic of circuit 501 is shown as residing within the charge pumps, this logic may also be located outside of the charge pumps.

Figure 6:
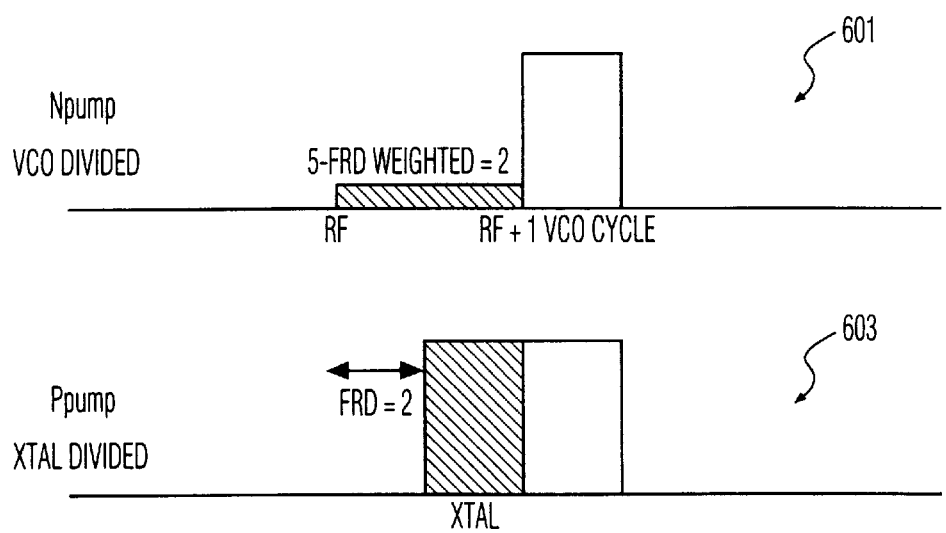
FIG. 6 illustrates the principle of the inventive fractional-N compensation scheme.

FIG. 6 shows the principle of the logic contained in FIG. 5, and represents the output of the charge pump system 307 as whole, as controlled by phase comparator 305. Because of the fractional division, the Npump 401b (FIG. 4) is turned ON early relative to the Ppump 401a (FIG. 4) by a known value: FRD×VCO period/Frac_ratio. For example, with a VCO frequency of 1 GHz, the VCO period (i.e., VCO cycle) is 1 ns. In the example where the fractional ratio is five and the fractional accumulator value is two (corresponding to FIG. 5(b), col. 2), the total amount of charge for the Npump is thus equal to: VCO period×(5-FRD)×$I_{pump}$. The total charge for the Ppump is equivalent to that of the Npump. The amplitude of $I_{pump}$ during partial turn ON is directly proportional to the delay in a manner that yields a charge being turned ON at the correct time. Thus, an earlier divider signal would result in a smaller output current for the first VCO period.

It should be noted that the graphs are not to scale. In effect, the shaded areas of both graphs 601, 602 are equal when proper compensation occurs. Utilizing this method, compensation is very accurate, irrespective of the VCO frequency, reference frequency (i.e., XTAL frequency), and the charge pump settings.

The present invention therefore performs fractional-N compensation in a way that alleviates particular problems with conventional fractional-N compensation schemes. By using a system of small individual charge pumps that can be turned ON and OFF individually, such a system of charge pumps can be partially turned ON at an earlier time than the occurrence of the divided reference signal. The remaining individual charge pumps within the system are then turned ON at a later time, after the divided reference signal. This compensation scheme eliminates matching concerns and preserves the advantages of fractional-N synthesis.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A fractional-N frequency synthesizer comprising:
   an accumulator for storing a value corresponding to a fractional ratio;
   a VCO divider that receives and divides a voltage controlled oscillator (VCO) pulse train to generate a divided VCO pulse train, the divided VCO pulse train being divided respectively by N and by N+1 in response to an output of the accumulator, wherein the accumulator provides a control signal to the VCO divider instructing the VCO divider to change the division from N to N+1 if the VCO divider is dividing by N or from N+1 to N if the VCO divider is dividing by N+1, where N is an integer;
   a phase comparator that receives a divided reference pulse train and a divided VCO pulse train and outputs phase error pulses with widths in proportion to a timing difference between the divided reference pulse train and the divided VCO pulse train; and a charge pump system comprising a plurality of charge pumps;

wherein the phase comparator includes compensation logic to selectively drive the charge pump system, the compensation logic turning ON a first portion of the charge pumps early and a second portion of the charge pumps late to drive the charge pump system to output a compensated current proportional to the phase error pulses.

2. The fractional-N frequency synthesizer as in claim 1, wherein each of the plurality of charge pumps is identical, the plurality being a multiple of the fractional ratio.

3. The fractional-N frequency synthesizer as in claim 1, wherein the plurality of charge pumps is weighted based upon the fractional ratio.

4. The fractional-N frequency synthesizer as in claim 1, wherein the compensation logic further comprises:

an up-command signal output for driving the first portion of the charge pump system; and a down-command signal output for driving the second portion of the charge pump system;

wherein the up-command signal and the down-command signal outputs are generated as a function of the divided reference pulse train, the divided VCO pulse train, and a delayed divided VCO pulse train.

5. The fractional-N frequency synthesizer as in claim 1, further comprising a delay circuit that receives the VCO pulse train and the divided VCO pulse train and supplies the divided VCO pulse train and a delayed divided VCO pulse train to the phase comparator, the delayed divided VCO pulse train being an integer multiple of VCO cycles away from the divided VCO pulse train.

6. The fractional-N frequency synthesizer as in claim 1, wherein the fractional ratio is five, and the accumulator increments the stored value by two.

7. The fractional-N frequency synthesizer as in claim 1, wherein the divided reference pulse train is derived from a crystal oscillator.

8. The fractional-N frequency synthesizer as in claim 1, where each charge pump comprises:

a first current source responsive to an up-command signal generated from the phase comparator for outputting a main current; and a second current source responsive to a down-command signal generated from the phase comparator for outputting an offset current.

9. The fractional-N frequency synthesizer as in claim 1, further comprising:

a reference frequency divider outputting the divided reference pulse train in response to a reference source signal;

a voltage controlled oscillator (VCO) outputting the VCO pulse train; and a loop filter for filtering the compensated current and for outputting an associated control voltage, the control voltage controlling the voltage controlled oscillator.

10. A fractional-N frequency synthesizer circuit, comprising:

an accumulator configured for storing a value that corresponds to a fractional ratio;

a delay circuit configured for supplying a divided VCO signal and a delayed divided VCO signal, wherein a timing difference between the divided VCO signal and the delayed divided VCO signal is an integer multiple of VCO cycles;

a charge pump system configured for outputting a compensated current; and a phase comparator configured for driving a portion of the charge pump system in response to the divided VCO signal and for driving a remaining portion of the charge pump system in response to the delayed divided VCO signal.

11. The fractional-N frequency synthesizer as in claim 10, wherein the charge pump system comprises a plurality of identical charge pumps, the plurality being a multiple of the fractional ratio.

12. The fractional-N frequency synthesizer as in claim 10, wherein the charge pump system comprise a plurality of charge pumps, the plurality of charge pumps being weighted based upon the fractional ratio.

13. The fractional-N frequency synthesizer as in claim 10, further comprising compensation logic that includes:

an up-command signal output for driving the portion of the charge pump system; and a down-command signal output for driving the remaining portion of the charge pump system, wherein the up-command signal and the down-command signal outputs are generated as a function of the divided reference pulse train, the divided VCO signal, and the delayed divided VCO signal.

14. The fractional-N frequency synthesizer as in claim 11, where each charge pump comprises:

a first current source responsive to an up-command signal generated from the phase comparator for outputting a main current; and a second current source responsive to a down-command signal generated from the phase comparator for outputting an offset current.

15. The fractional-N frequency synthesizer circuit of claim 10, wherein the fractional ratio is five, and the accumulator increments the stored value by two.

16. The fractional-N frequency synthesizer circuit of claim 10, wherein the divided VCO signal is divided respectively by N and N+1 in response to an output of the accumulator, where N is an integer.

17. A method of providing fractional-N compensation, the method comprising:

generating a VCO signal;

dividing the VCO signal;

generating a delayed divided VCO signal that is an integer multiple of VCO cycles away in time from the divided VCO signal;

detecting a phase error between a divided reference signal and the divided VCO signal;

selectively activating a portion of a charge pump system based upon the divided VCO signal;

activating a remaining portion of the charge pump system based upon the delayed divided VCO signal;

outputting a compensated current produced by the charge pump system; and filtering the compensated current for input into a VCO for producing said VCO signal.

18. The fractional-N frequency synthesizer as in claim 17, wherein the charge pump comprises a plurality of identical charge pumps, the plurality being a multiple of a fractional ratio.

19. The fractional-N frequency synthesizer as in claim 17, wherein the charge pump system comprises a plurality of charge pumps, the plurality of charge pumps being weighted based upon a fractional ratio.

20. The method as in claim 17, wherein the fractional ratio is five.

21. The method as in claim 17, wherein the step of detecting further comprises generating an up-command signal and a down-command signal for driving the charge pump system in response to the divided VCO signal and the delayed divided VCO signal.

22. The method as in claim 17, wherein the steps of dividing the VCO signal and generating the delayed divided VCO signal utilize an N divider and an N+1 divider, where N is an integer.

23. The method as in claim 17, further comprising incrementing a fractional accumulator value corresponding to a fractional ratio, wherein the steps of dividing the divided VCO signal and generating the delayed divided VCO signal is based upon the fractional accumulator value.

24. The method as in claim 23, wherein the incrementing step increments by two, the fractional ratio being five.

25. The method as in claim 17, wherein the divided reference signal is derived from a crystal oscillator.

* * * * *